(12) United States Patent
Arai et al.

(10) Patent No.: US 11,839,156 B2
(45) Date of Patent: Dec. 5, 2023

(54) TEMPERATURE DIFFERENCE POWER GENERATION APPARATUS AND MEASUREMENT SYSTEM

(71) Applicants: YOKOGAWA ELECTRIC CORPORATION, Tokyo (JP); COLLECTIVE INTELLIGENCE, Fujisawa (JP)

(72) Inventors: Takashi Arai, Tokyo (JP); Yusaku Yoshida, Tokyo (JP); Shuichi Sato, Tokyo (JP); Hiroo Urabe, Tokyo (JP); Yoshiyasu Takefuji, Fujisawa (JP)

(73) Assignees: YOKOGAWA ELECTRIC CORPORATION, Tokyo (JP); COLLECTIVE INTELLIGENCE, Fujisawa (JP)

( * ) Notice: Subject to any disclaimer, the term of this patent is extended or adjusted under 35 U.S.C. 154(b) by 610 days.

(21) Appl. No.: 16/431,804

(22) Filed: Jun. 5, 2019

(65) Prior Publication Data

US 2019/0376848 A1 Dec. 12, 2019

(30) Foreign Application Priority Data

Jun. 7, 2018 (JP) .................................. 2018-109437

(51) Int. Cl.
| | |
|---|---|
| *H10N 10/17* | (2023.01) |
| *G01K 7/02* | (2021.01) |
| *H10N 10/10* | (2023.01) |
| *H10N 10/80* | (2023.01) |
| *G01K 7/00* | (2006.01) |

(52) U.S. Cl.
CPC ............... *H10N 10/17* (2023.02); *G01K 7/02* (2013.01); *H10N 10/10* (2023.02); *H10N 10/80* (2023.02); *G01K 7/003* (2013.01)

(58) Field of Classification Search
CPC ......... H01L 35/28; H01L 35/30; H01L 35/32; G01K 7/003
See application file for complete search history.

(56) References Cited

U.S. PATENT DOCUMENTS

| | | | |
|---|---|---|---|
| 4,520,305 A | 5/1985 | Cauchy | |
| 6,233,944 B1 * | 5/2001 | Yamada | .................. H01L 35/32 62/3.7 |
| 6,880,346 B1 * | 4/2005 | Tseng | ..................... H01L 23/467 257/E23.099 |

(Continued)

FOREIGN PATENT DOCUMENTS

| | | |
|---|---|---|
| CN | 204390843 U | 6/2015 |
| CN | 107528499 A | 12/2017 |

(Continued)

*Primary Examiner* — Lindsey A Buck
(74) *Attorney, Agent, or Firm* — Sughrue Mion, PLLC

(57) ABSTRACT

A temperature difference power generation apparatus according to one aspect of the present invention includes a thermoelectric conversion element configured to convert thermal energy into electric energy based on a temperature difference, radiation fins which are thermally connected to a low-temperature side of the thermoelectric conversion element and contactable to outside air, and a pipe which is thermally connected to a high-temperature side of the thermoelectric conversion element and through which a high-temperature fluid at a higher temperature than the outside air is flowable.

17 Claims, 9 Drawing Sheets

(56) References Cited

U.S. PATENT DOCUMENTS

| | | | | |
|---|---|---|---|---|
| 2008/0083445 A1* | 4/2008 | Chakraborty | ........... | F28D 15/02 |
| | | | | 136/205 |
| 2008/0083446 A1* | 4/2008 | Chakraborty | ........... | H01L 35/00 |
| | | | | 136/205 |
| 2008/0142067 A1 | 6/2008 | Dell et al. | | |
| 2010/0314078 A1 | 12/2010 | Lin et al. | | |
| 2013/0005372 A1 | 1/2013 | Strei et al. | | |
| 2016/0146083 A1* | 5/2016 | Lang | ..................... | F01N 5/025 |
| | | | | 60/320 |

FOREIGN PATENT DOCUMENTS

| | | |
|---|---|---|
| CN | 107592035 A | 1/2018 |
| GB | 2145876 A | 4/1985 |
| GB | 2483369 A | 3/2012 |
| JP | 10-113845 A | 5/1998 |
| JP | 11-215867 A | 8/1999 |
| JP | 3079577 U | 8/2001 |
| JP | 2002-030717 A | 1/2002 |
| JP | 2010-505383 A | 2/2010 |
| JP | 2013-45929 A | 3/2013 |
| JP | 5989302 B2 | 9/2016 |
| TW | 201043400 A1 | 12/2010 |
| WO | 2010/090350 A1 | 8/2010 |

\* cited by examiner

TEMPERATURE DIFFERENCE POWER GENERATION APPARATUS AND MEASUREMENT SYSTEM

BACKGROUND OF THE INVENTION

Field of the Invention

The present invention relates to a temperature difference power generation apparatus and a measurement system.

Priority is claimed on Japanese Patent Application No. 2018-109437, filed Jun. 7, 2018, the content of which is incorporated herein by reference.

Background

A power generation system as disclosed in Japanese Patent No. 5989302 (hereinafter, referred to as "Patent Document 1"), for example, has been known as a temperature difference power generation apparatus. This power generation system is an apparatus for converting a temperature difference between exhaust heat energies of hot springs and the like into electric energy and incorporates thermoelectric conversion elements with the Thomson effect, the Peltier effect, the Seebeck effect and the like. Among relatively small-scale power generation apparatuses that generate electric power using exhaust heat energy of hot springs and the like, an apparatus incorporating thermoelectric conversion elements with the Seebeck effect is particularly attracting attention. The Seebeck effect is the effect of a phenomenon in which a temperature difference between objects is converted into electric power. This is a phenomenon in which electrons are activated when a temperature difference between thermal energies is generated in a Seebeck element, that is, an element configured with a p-type thermoelectric material and an n-type thermoelectric material which are alternately disposed, between a high temperature part and a low temperature part of thermal energy, the n-type thermoelectric material diffuses to a high temperature side and the p-type thermoelectric material diffuses to a low temperature side to cause a current to flow and thus the thermal energy is converted into electric energy.

The power generation system disclosed in Patent Document 1 is a power generation system including a thermoelectric conversion element which converts thermal energy into electric energy according to a temperature difference, a first heat pipe which adheres to the thermoelectric conversion element across it and is installed in a high-temperature side fluid, a second heat pipe which adheres to the thermoelectric conversion element across it and is installed in a low-temperature side fluid facing the first heat pipe, a holder which holds the thermoelectric conversion element to the first heat pipe and the second heat pipe, and a partition wall body which shuts off the high-temperature side fluid permeating the first heat pipe from the low-temperature side fluid permeating the second heat pipe. In this power generation system, the high-temperature side fluid and the low-temperature side fluid are the same hot water having different temperatures, the low-temperature side fluid is disposed at a water level relatively lower than the water level of the high-temperature side fluid and is a fluid flowing from a high-temperature side to a low-temperature side through a natural flow.

SUMMARY

In the above-described conventional technology, a power generation system is installed in a hot spring flow channel (a river or a water channel) through which hot springs flow because a temperature difference of hot water flowing from a high-temperature side to a low-temperature side through a natural flow is used. However, strongly acidic or strongly alkaline hot water rises from the hot spring flow channel as steam and thus thermoelectric conversion elements, the heat pipes, radiation fins and the like are easily corroded. Accordingly, it is necessary to perform maintenance or exchange at short intervals, for example, about one month.

One aspect of the present invention provides a temperature difference power generation apparatus and a measurement system capable of continuing temperature difference power generation over a long period of time even when a high-temperature fluid is a corrosive fluid.

A temperature difference power generation apparatus according to a first aspect of the present invention may include a thermoelectric conversion element configured to convert thermal energy into electric energy based on a temperature difference, radiation fins which are thermally connected to a low-temperature side of the thermoelectric conversion element and contactable to outside air, and a pipe which is thermally connected to a high-temperature side of the thermoelectric conversion element and through which a high-temperature fluid at a higher temperature than the outside air is flowable.

According to this configuration, the thermoelectric conversion device can convert thermal energy into electric energy according to a temperature difference between the high-temperature fluid flowing through the pipe and the outside air at a lower temperature than the high-temperature fluid. The thermoelectric conversion element and the radiation fins are not exposed to steam of the high-temperature fluid because the high-temperature fluid flows through the inside of the pipe. Accordingly, the thermoelectric conversion element and the radiation fins are not easily corroded and thus temperature difference power generation can be continued over a long period of time.

A measurement system according to a second aspect of the present invention may include the above-described temperature difference power generation apparatus and a field device including a measurer configured to measure a state quantity of the high-temperature fluid and a communicator configured to provide a measurement result of the measurer to an outside of the field device. The temperature difference power generation apparatus may be configured to supply electric power to the field device.

According to this configuration, since it is possible to measure a state quantity of a high-temperature fluid according to generated electric power while performing private power generation according to the high-temperature fluid and communicate measurement results with the outside, when the high-temperature fluid wells up in an isolated area in a mountain, for example, a state quantity of the high-temperature fluid can be monitored without drawing a power line to the isolated area and without a person going there.

According to the aforementioned aspects of the present invention, it is possible to continue temperature difference power generation over a long period of time even when a high-temperature fluid is a corrosive fluid.

DETAILED DESCRIPTION OF THE INVENTION

Hereinafter, an embodiment of the present invention will be described with reference to the drawings.

Figure 1:
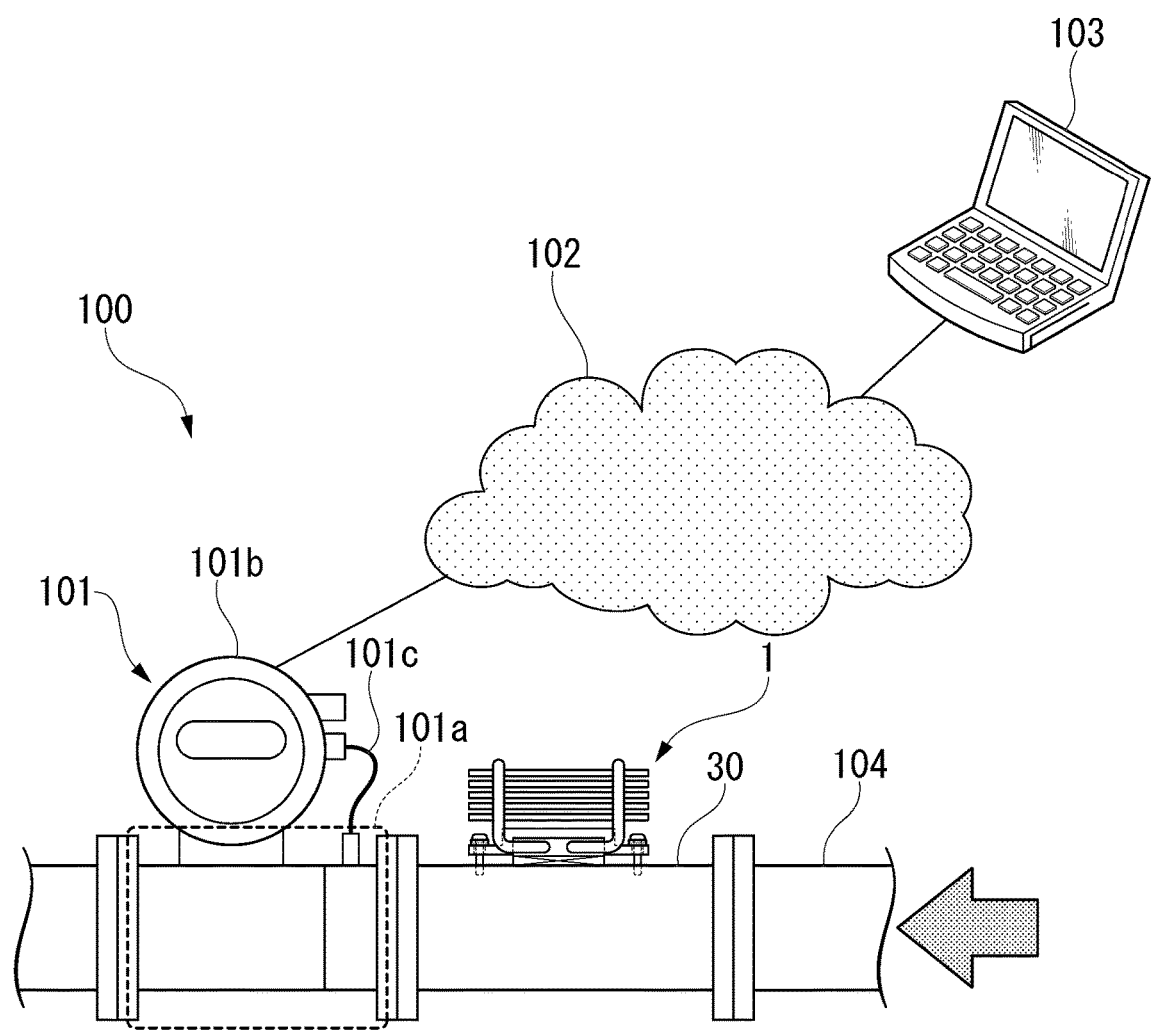
FIG. 1 is a schematic diagram showing a measurement system having a temperature difference power generation apparatus according to an embodiment.

FIG. 1 is a schematic diagram showing a measurement system 100 including a temperature difference power generation apparatus 1 according to an embodiment.

The measurement system 100 includes, for example, the temperature difference power generation apparatus 1 and a field device 101. The field device 101 is connected to a terminal 103 through a communication network 102. In the present embodiment, the temperature difference power generation apparatus 1 and the field device 101 are installed near a water source in a mountain where a hot spring (hot water) wells up, for example. The field device 101 measures a state quantity of hot water (high-temperature fluid) flowing through a hot spring supply pipe 104. Here, "high-temperature fluid" refers to a fluid hotter than the outside air.

The field device 101 includes a measurer 101a which measures a state quantity of a measurement target and a communicator 101b (field device main body) which provides a measurement result of the measurer 101a to the outside. In the present embodiment, the measurer 101a includes a pipe to which the communicator 101b is attached. The measurer 101a measures a state quantity of hot water flowing through the hot spring supply pipe 104. This measurer 101a may include a temperature sensor, a pressure sensor, a flow rate sensor, a pH sensor or the like, for example.

The communicator 101b and the measurer 101a are connected to each other through a transmission line 101c. Although the transmission line 101c is arranged through the outside of the main body of the field device 101 and the measurer 101a in FIG. 1, the present invention is not limited thereto. The transmission line 101c may be arranged through the inside of the main body of the field device 101.

For example, the transmission line 101c includes, for example, a transmission line used to transmit analog signals of "4 to 20 mA," a transmission line used to transmit pulse signals of "0 to 1 kHz" and a transmission line through which a high signal/low signal is transmitted according to whether a contact (not shown) provided inside of the field device 101 is on or off.

The communicator 101b stores measurement result information based on measurement values (e.g., temperature, pressure, flow rate, pH value and the like) acquired from the measurer 101a. The communicator 101b performs various statistical processes using stored measurement result information and store statistical information based on results of the statistical processes.

The terminal 103 is a computer device, for example, a personal computer or the like. The communicator 101b and the terminal 103 are connected through communication via the communication network 102 (for example, the Internet, a Local Area Network (LAN), or the like).

The communicator 101b is a communication interface for connection to the terminal 103 through communication via the communication network 102. The communicator 101b is connected to the communication network 102 through wireless communication and transmits stored measurement result information and statistical information to the terminal 103 (external device). Wireless communication mentioned here may be wireess communication conforming to a wireless communication standard such as Wi-Fi (registered trademark), WiMAX (registered trademark) or 3G/LTE (registered trademark).

Although the communicator 101b is connected to the communication network 102 through communication via wireless communication in the present embodiment, the communicator 101b may be connected to the communication network 102 through communication via wired communication.

The terminal 103 receives and displays information transmitted from the communicator 101b, for example, measurement result information based on measurement values (for example, temperatures, pressure values, flow rates, pH values or the like) measured by the measurer 101a, and statistical information based on results of the above-described statistical processes.

Transmission of information from the communicator 101b to the terminal 103 may be performed at the request of the terminal 103 for the communicator 101b or may be periodically performed by the communicator 101b.

This field device 101 is provided with electric power from the temperature difference power generation apparatus 1 installed adjacent thereto through a power line which is not shown. That is, the field device 101 can continue the above-described operation without using a battery and drawing a power line from the surroundings. That is, it is not necessary to provide wiring in areas other than the space between the field device 101 and the temperature difference power generation apparatus 1. However, the field device 101 may be equipped with a battery for maintenance and emergency use.

Figure 2:
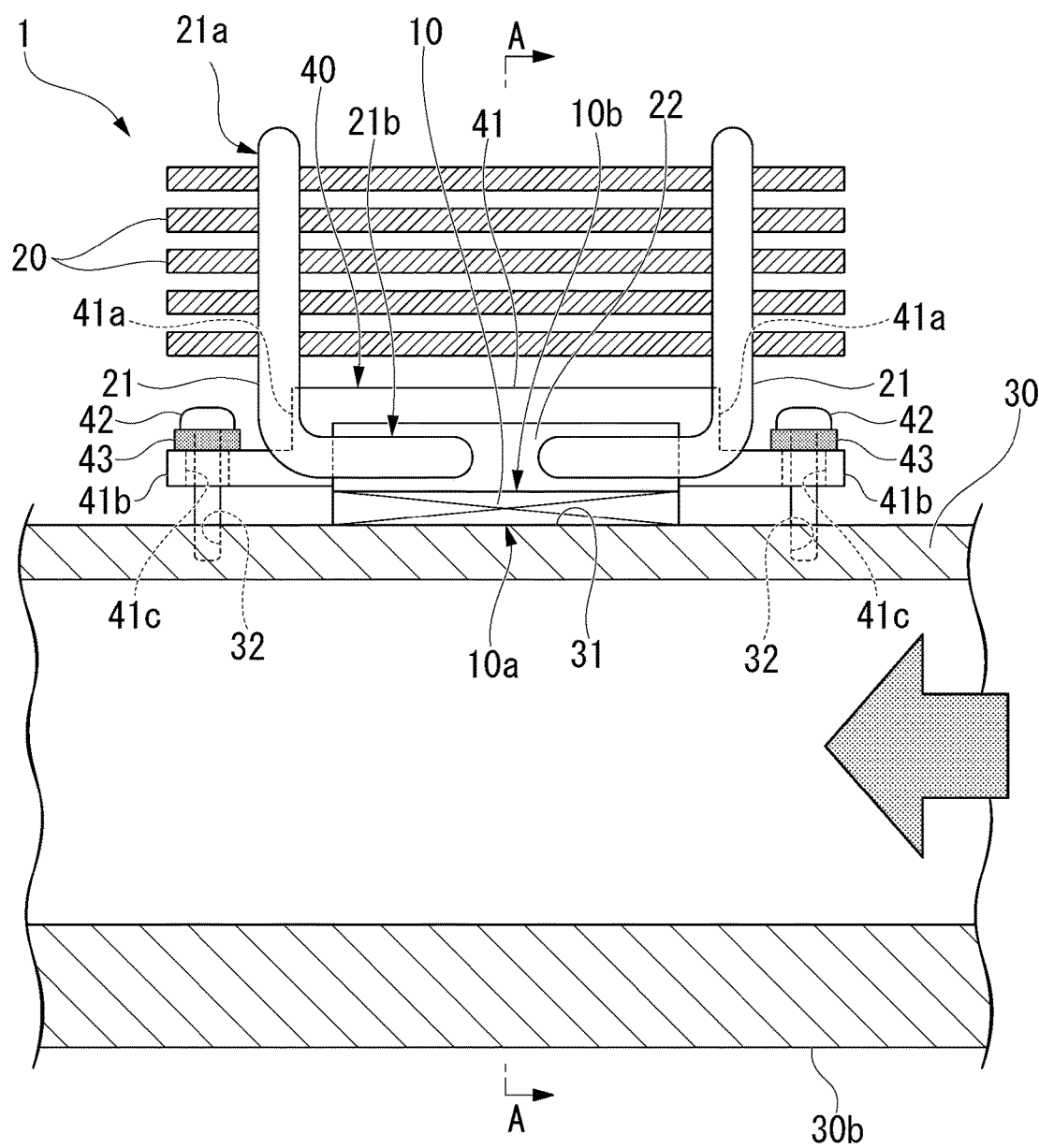
FIG. 2 is a cross-sectional diagram of a configuration of the temperature difference power generation apparatus according to an embodiment.
Figure 3:
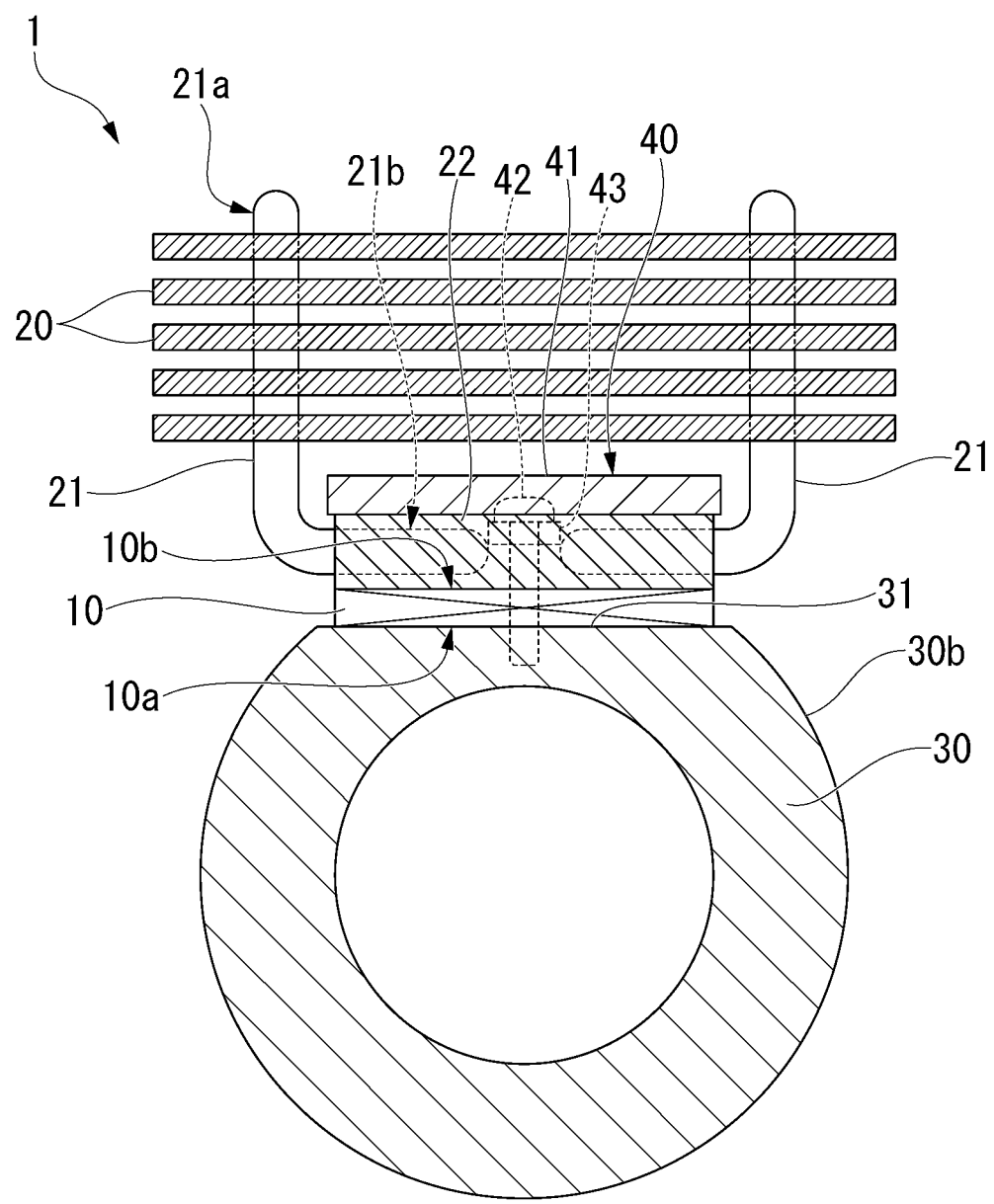
FIG. 3 is a diagram viewed in the direction of the arrow A-A in FIG. 2.

FIG. 2 is a cross-sectional diagram of a configuration of the temperature difference power generation apparatus 1 according to an embodiment. FIG. 3 is a diagram viewed in the direction of the arrow A-A in FIG. 2. As shown in FIG. 2, the temperature difference power generation apparatus 1 includes a thermoelectric conversion element 10, radiation fins 20, a pipe 30 and a pressing mechanism 40.

The thermoelectric conversion element 10 converts thermal energy into electric energy according to a temperature difference between the outside air (for example, about 20° C.) and hot water (for example, about 90° C.). In the present embodiment, a Seebeck element with the Seebeck effect is used as the thermoelectric conversion element 10. A high-temperature side 10a of the thermoelectric conversion element 10 is thermally connected to the pipe 30. A low-temperature side 10b of the thermoelectric conversion element 10 is thermally connected to the radiation fins 20 on the side opposite the high-temperature side 10a. The thermoelectric conversion element 10 may be an element having the Thomson effect, the Peltier effect or the like.

The radiation fins 20 are thermally connected to the low-temperature side 10b of the thermoelectric conversion element 10 through heat pipes 21. The radiation fins 20 may include a metal material having a high heat dissipation property, for example, aluminum, an aluminum alloy or the like. The radiation fins 20 are formed in the form of rectangular plates and have a stack structure in which they are stacked with gaps therebetween. The radiation fins 20 are supported by one end parts 21a of the heat pipes 21. The one end parts 21a of the heat pipes 21 penetrate the plurality of stacked radiation fins 20 to be bonded to the plurality of radiation fins 20.

The other end parts 21b of the heat pipes 21 are thermally connected to the low-temperature side 10b of the thermoelectric conversion element 10 through a base plate 22. The base plate 22 may include copper or a copper alloy having high heat conductivity. The base plate 22 is connected to the low-temperature side 10b of the thermoelectric conversion element 10. As shown in FIG. 3, the width of the base plate 22 is similar to the width of the thermoelectric conversion element 10. A thermal grease or the like may be coated between the base plate 22 and the thermoelectric conversion element 10.

A plurality of heat pipes 21 are installed in the base plate 22. In the present embodiment, four heat pipes 21 are installed in the base plate 22. The four heat pipes 21 extend from the side edge faces of both sides of the base plate 22 in the width direction to both sides thereof in the width direction to support four corners of the radiation fins 20. An additional plurality of heat pipes 21 may be installed in the base plate 22.

The pipe 30 is connected to the hot spring supply pipe 104. The pipe 30 has hot water flowing thereinside, as shown in FIG. 1. This pipe 30 may include a material having a corrosion resistance to hot water, for example, stainless steel or the like. The pipe 30 may include a resin material or the like having corrosion resistance to hot water. As shown in FIG. 3, a plane part 31 is formed on the outer circumferential surface 30b of the pipe 30. The plane part 31 is obtained by cutting a part of the outer circumferential surface 30b of the pipe 30 in parallel to a tangent of the outer circumferential surface 30b.

The high-temperature side 10a of the thermoelectric conversion element 10 is in contact with the plane part 31. The plane part 31 may be mirror-finished. Accordingly, the surface roughness (unevenness) in the plane part 31 decreases, increasing a contact area between the plane part 31 and the high-temperature side 10a of the thermoelectric conversion element 10. A thermal grease or the like may be coated between the plane part 31 and the thermoelectric conversion element 10.

The pressing mechanism 40 presses the high-temperature side 10a of the thermoelectric conversion element 10 to the side of the pipe 30, as shown in FIG. 2. The pressing mechanism 40 includes a pressing plate 41, screw members 42 and resin washers 43 (insulators). As shown in FIG. 3, the pressing plate 41 is arranged to extend in the longitudinal direction of the pipe 30 between the left and right heat pipes 21. As shown in FIG. 2, the pressing plate 41 straddles the outer sides (sides opposite the thermoelectric conversion element) of the base plate 22.

As shown in FIG. 3, the width of the pressing plate 41 may be greater than the width of the thermoelectric conversion element 10 (base plate 22). Accordingly, the whole area of the high-temperature side 10a of the thermoelectric conversion element 10 can be pressed to the plane part 31. As shown in FIG. 2, a first bent part 41a that bends to the side of the pipe 30 and a second bent part 41b that bends from the tip of the first bent part 41a in the longitudinal direction of the pipe 30 are formed on both edges of the pressing mechanism 41.

The first bent part 41a faces and comes into contact with an edge face of the base plate 22 in the longitudinal direction of the pipe 30. The second bent part 41b has a through-hole 41c formed therein, which extends in parallel to the longitudinal direction of the pipe 30. The screw member 42 is inserted into the through-hole 41c. The screw member 42 is screw-engaged with a screw hole 32 formed in the plane part 31 of the pipe 30. The through-hole 41c may have a diameter greater than the shaft part of the screw member 42 and a gap may be provided between the through-hole 41c and the shaft part.

The resin washer 43 is disposed behind the head part of the screw member 42. This resin washer 43 is interposed between the screw member 42 and the pressing plate 41 and blocks a heat transfer path starting from the pipe 30 and reaching the low-temperature side 10b of the thermoelectric conversion element 10 through the screw member 42 and the pressing plate 41. That is, the resin washer 43 blocks a heat transfer path other than a heat transfer path starting from the pipe 30 and reaching the high-temperature side 10a of the thermoelectric conversion element 10. A part of the resin washer 43 may extend to be inserted into a gap between the shaft part of the screw member 42 and the through-hole 41c. The pressing plate 41 or the screw member 42 may be formed of a heat insulating material (resin material or the like) instead of the resin washer 43.

According to the temperature difference power generation apparatus 1 having the aforementioned configuration, the thermoelectric conversion element 10 converts thermal energy into electric energy according to a temperature difference between hot water flowing through the pipe 30 and the outside air at a lower temperature than the hot water. Since hot water flows through the inside of the pipe 30, the thermoelectric conversion element 10, the radiation fins 20 and the like are not exposed to steam of the hot water. Accordingly, the thermoelectric conversion element 10, the radiation fins 20 and the like are not easily corroded and thus temperature difference power generation can be continued without maintenance over a long period of time.

In the present embodiment, the pressing mechanism 40 which presses the high-temperature side 10a of the thermoelectric conversion element 10 to the side of the pipe 30 is provided, as shown in FIG. 2. According to this configuration, power generation can be performed with high efficiency because heat transfer efficiency from the side of the pipe 30 with respect to the thermoelectric conversion element 10 is improved according to pressing of the pressing mechanism 40. Further, since the resin washer 43 (heat insulating part) is provided in the pressing mechanism 40 and heat transfer from the side of the pipe 30 through the screw member 42 and the pressing plate 41 is blocked, heat transfer efficiency from the side of the pipe 30 with respect to the thermoelectric conversion element 10 does not deteriorate.

Furthermore, in the present embodiment, the plane part 31 is formed on the outer circumferential surface 30b of the pipe 30 and the high-temperature side 10a of the thermoelectric conversion element 10 is in contact with the plane part 31, as shown in FIG. 3. According to this configuration, the high-temperature side 10a of the thermoelectric conversion element 10 and the pipe 30 easily adhere to each other, and thus heat transfer efficiency can be improved and power generation can be performed with high efficiency.

In this manner, it is possible to continue temperature difference power generation over a long period of time even if a high-temperature fluid is corrosive hot water since the temperature difference power generation apparatus 1 according to the above-described present embodiment includes the thermoelectric conversion element 10 which converts thermal energy into electric energy according to a temperature difference, the radiation fins 20 which are thermally connected to the low-temperature side 10b of the thermoelectric conversion element 10 and exposed to the outside air, and the pipe 30 which is thermally connected to the high-temperature side 10a of the thermoelectric conversion element 10 and through the inside of which hot water is able to flow.

The measurement system 100 of the present embodiment includes the above-described temperature difference power generation apparatus 1 and the field device 101 including the measurer 101a which measures a state quantity of hot water and the communicator 101b which provides measurement results of the measurer 101a to the outside, and the temperature difference power generation apparatus 1 supplies electric power to the field device 101, as shown in FIG. 1. According to this configuration, it is possible to measure a state quantity of hot water according to generated electric power while performing private power generation according to hot water and communicate measurement results with the outside. Accordingly, when hot water wells up in an isolated area in a mountain, for example, a state quantity of hot water can be monitored without drawing a power line to the isolated area and without a person going there.

Although a preferred embodiment of the present invention has been described above with reference to the drawings, the present invention is not limited to the aforementioned embodiment. Various shapes, combinations and the like of each component member described in the above-described embodiment are exemplary and can be modified in various manners on the basis of design requests and the like without departing from the scope of the present invention.

For example, forms shown in FIGS. 4 to 9 can be employed in the present invention. The same reference numbers will be used to refer to the same elements as those in the above-described embodiment in the following description of the drawings and description thereof will be simplified or omitted.

Figure 4:
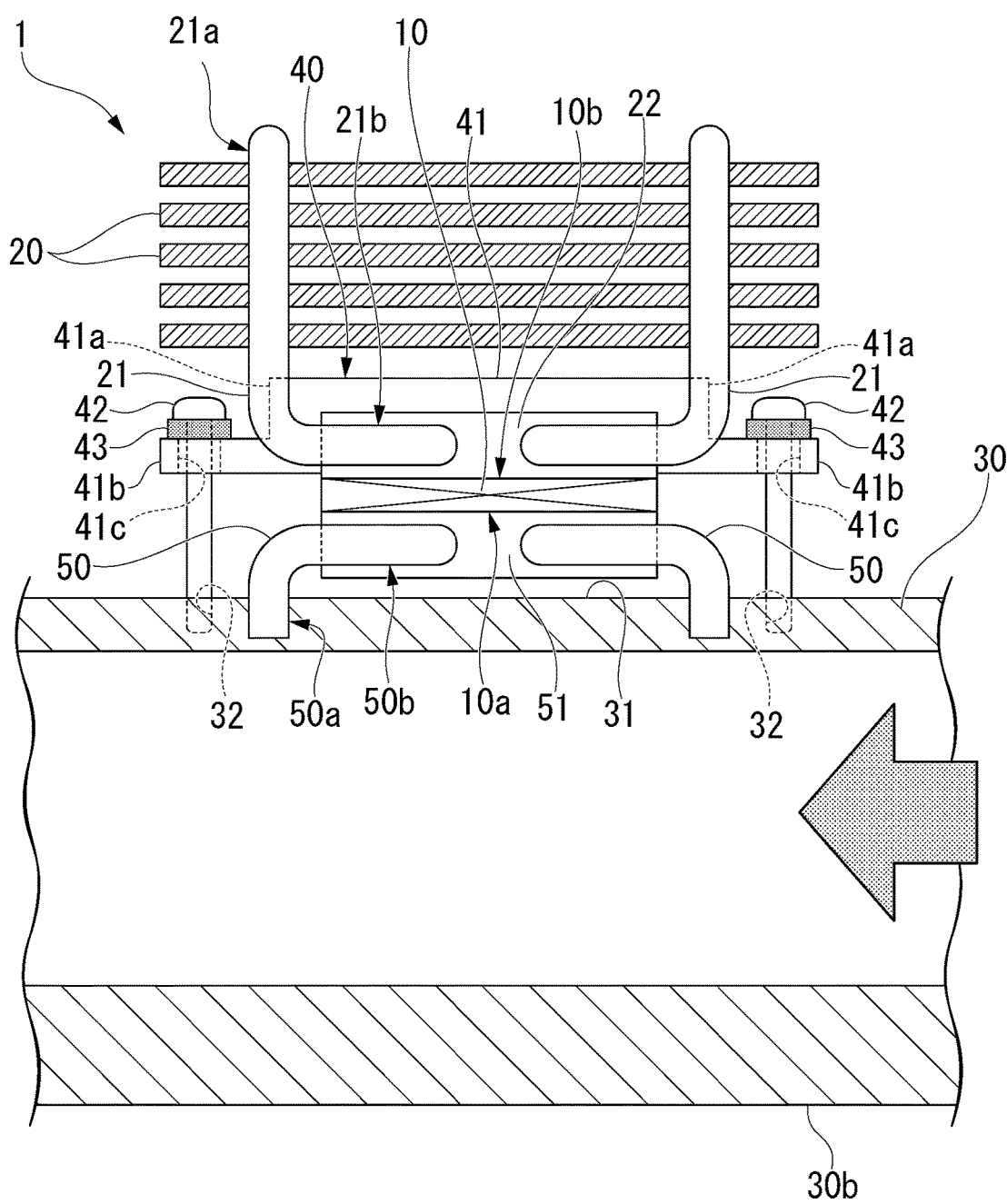
FIG. 4 is a cross-sectional diagram of a configuration of a temperature difference power generation apparatus according to an application example of an embodiment.

In the form shown in FIG. 4, the high-temperature side 10a of the thermoelectric conversion element 10 is thermally connected to the pipe 30 through heat pipes 50. According to this configuration, it is possible to improve heat transfer efficiency and generate power with high efficiency because heat can be transported using latent heat of vaporization of a sealing liquid of the heat pipes 50. One end parts 50a (parts) of the heat pipes 50 may be buried in the pipe 30. According to this configuration, the contact area between the heat pipes 50 and the pipe 30 increases and thus heat transfer efficiency can be improved and power can be generated with high efficiency.

In this form, the thermoelectric conversion element 10 may be supported by the heat pipes 50 and a gap between the thermoelectric conversion element 10 and the pipe 30 may be provided (that is, the thermoelectric conversion element 10 may be floated) in order to block heat transfer paths other than the heat pipes 50. The other end parts 50b of the heat pipes 50 are thermally connected to the high-temperature side 10a of the thermoelectric conversion element 10 through a base plate 51. The base plate 51 may include copper, a copper alloy or the like having high thermal conductivity like the base plate 22.

Figure 5:
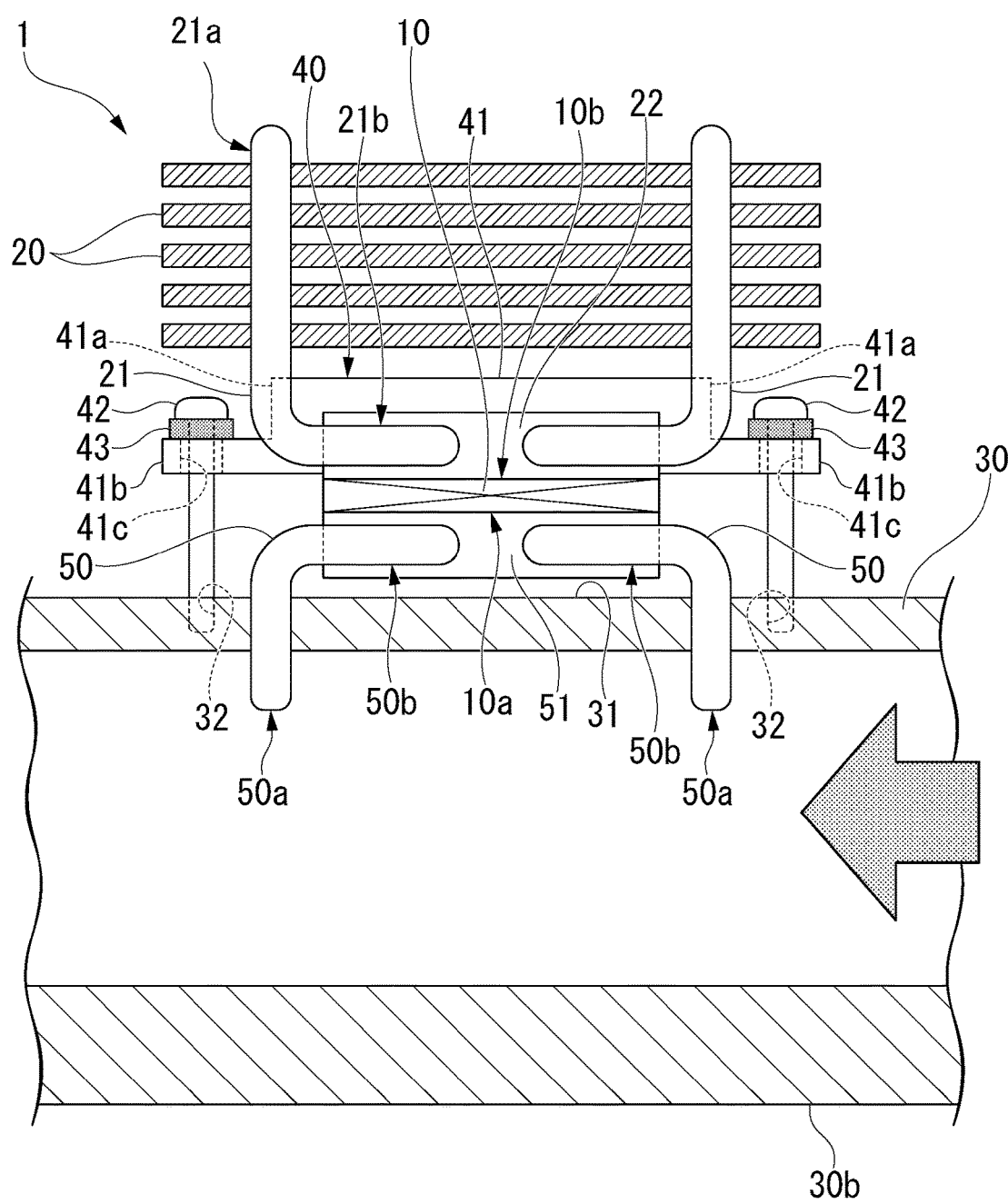
FIG. 5 is a cross-sectional diagram of a configuration of a temperature difference power generation apparatus according to an application example of an embodiment.

In the form shown in FIG. 5, the one end parts 50a of the heat pipes 50 are arranged to penetrate the pipe 30. According to this configuration, power can be generated with higher efficiency because the heat pipes 50 can be caused to directly come into contact with hot water. In this case, the heat pipes 50 may include a material having corrosion resistance.

Figure 6:
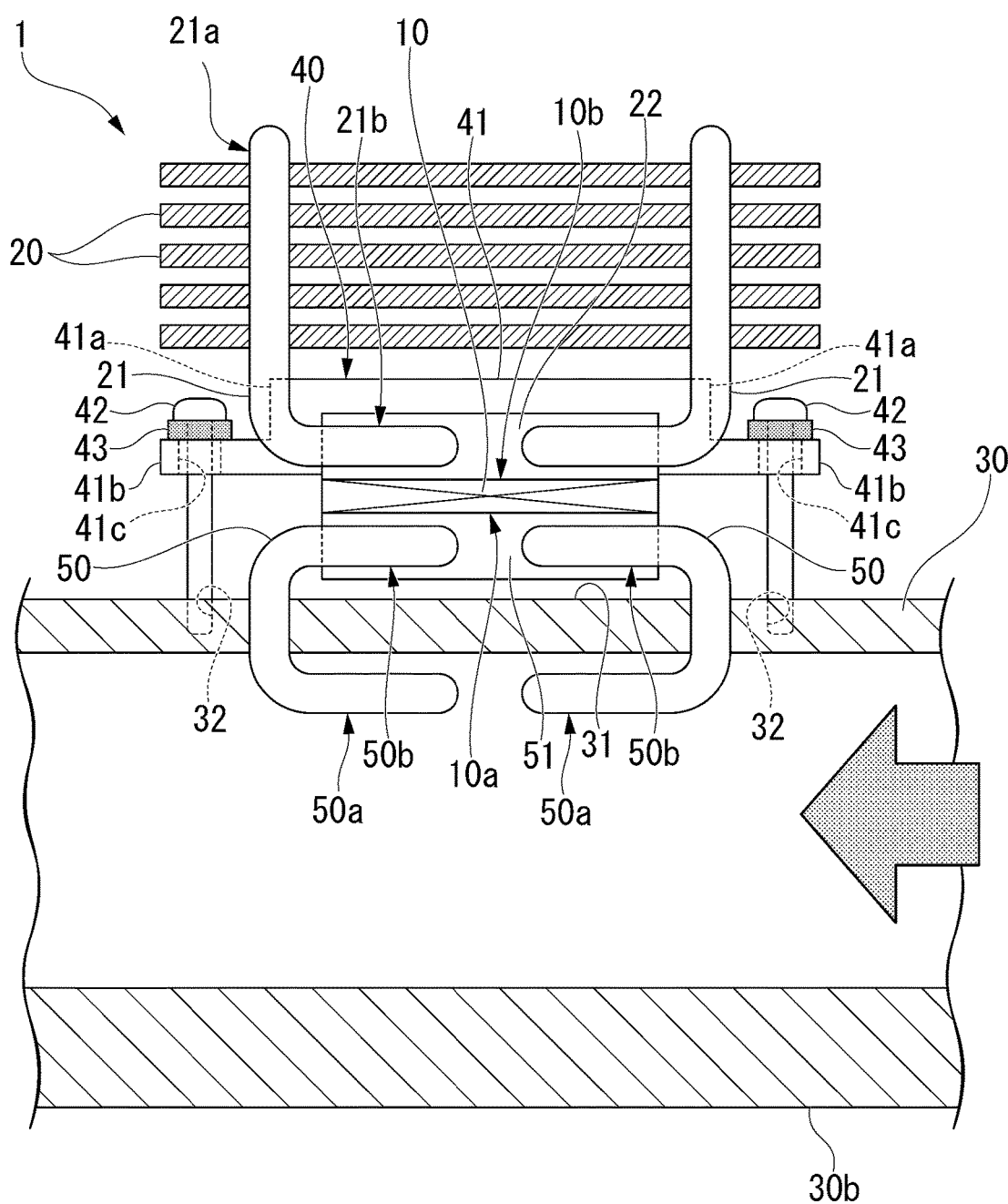
FIG. 6 is a cross-sectional diagram of a configuration of a temperature difference power generation apparatus according to an application example of an embodiment.

In the form shown in FIG. 6, the one end parts 50a of the heat pipes 50 are bent inside the pipe 30. According to this configuration, it is possible to generate power with higher efficiency because the heat pipes 50 can be caused to directly come into contact with hot water as in the form shown in FIG. 5 and the area coming into contact with hot water can be increased according to bending compared to the form shown in FIG. 5. The bending direction of the heat pipes 50 may be any of upstream and downstream with respect to the flow of hot water.

Figure 7:
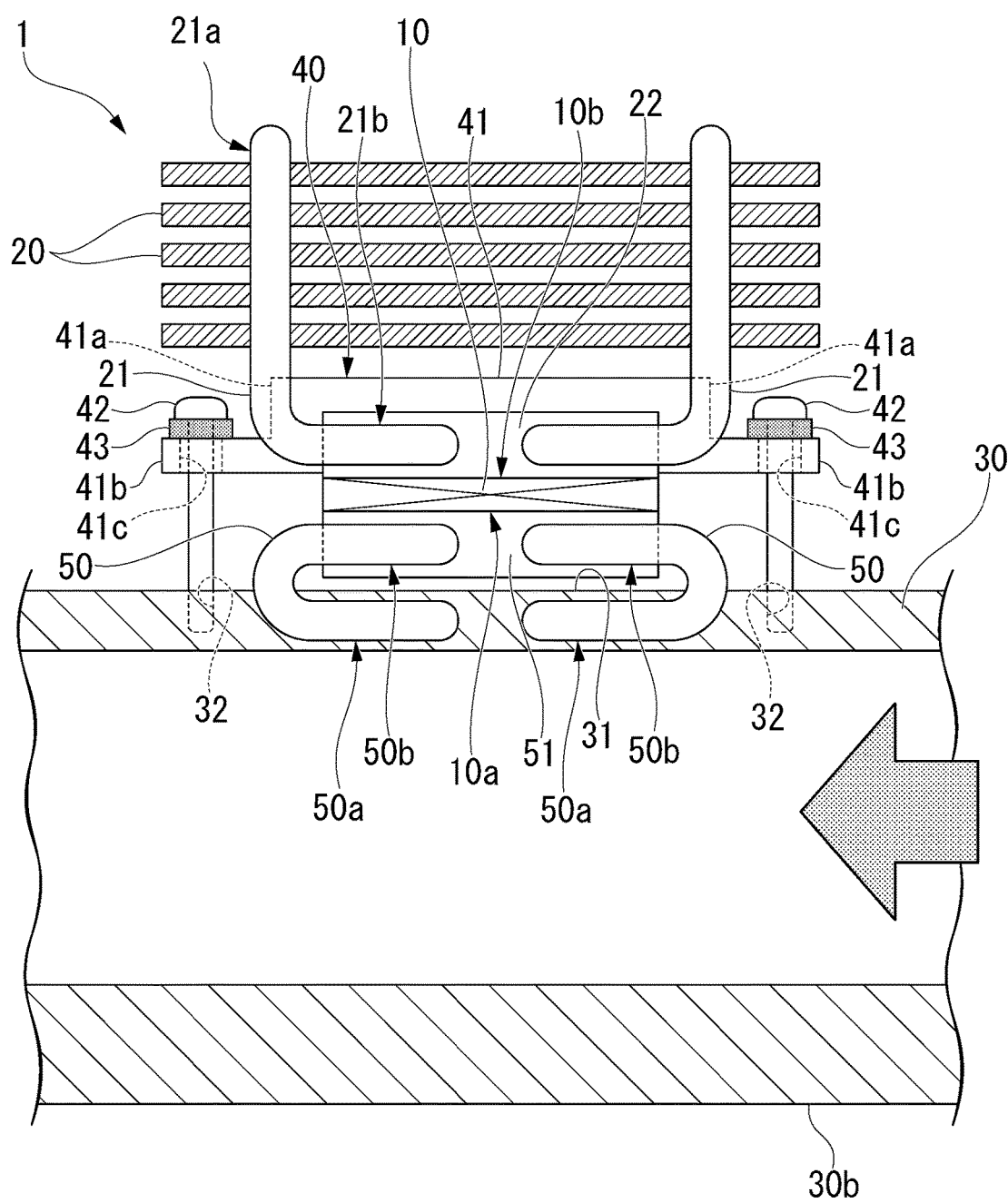
FIG. 7 is a cross-sectional diagram of a configuration of a temperature difference power generation apparatus according to an application example of an embodiment.

In the form shown in FIG. 7, the heat pipes 50 are buried in the pipe 30 in a state in which the one end parts 50a thereof are bent. According to this configuration, it is not necessary to form the heat pipes 50 of a material having corrosion resistance because the heat pipes 50 do not directly come into contact with hot water. It is possible to improve heat transfer efficiency and generate power with high efficiency because a distance between the heat pipes 50 and hot water decreases.

Figure 8:
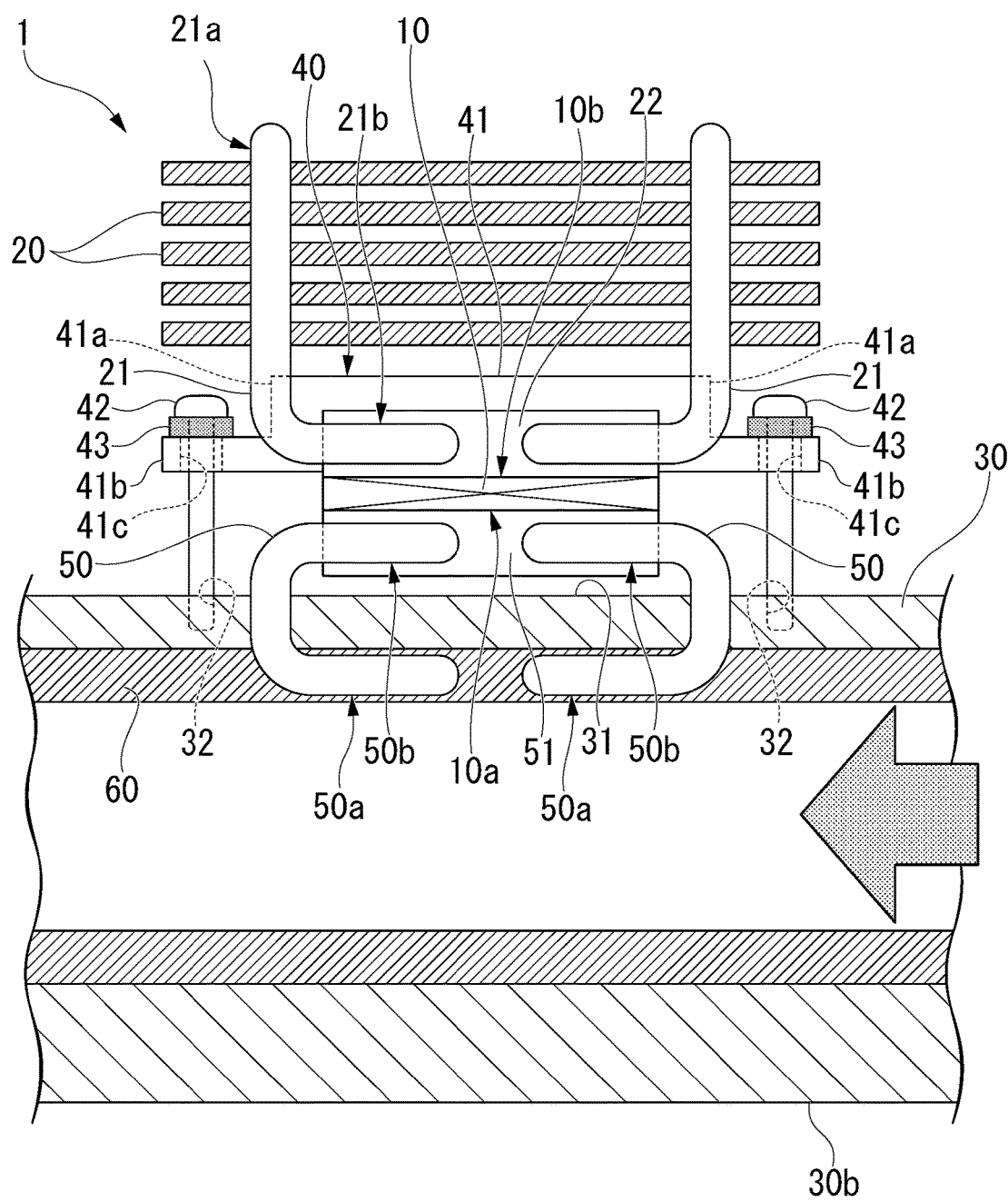
FIG. 8 is a cross-sectional diagram of a configuration of a temperature difference power generation apparatus according to an application example of an embodiment.

In the form shown in FIG. 8, the one end parts 50a of the heat pipes 50 penetrate the pipe 30 to be buried in a lining material 60 contained in the pipe 30. The lining material 60 is formed from a resin material or the like having corrosion resistance to hot water. According to this configuration, it is possible to generate power with high efficiency even in the case of corrosive hot water because the heat pipes 50 inserted into the inside of the pipe 30 are buried in the lining material 60. This configuration can be manufactured more cheaply than the form shown in FIG. 7 (for example, casting). The distance between the heat pipes 50 and hot water decreases and thus heat transfer efficiency can be improved and power can be generated with high efficiency.

Figure 9:
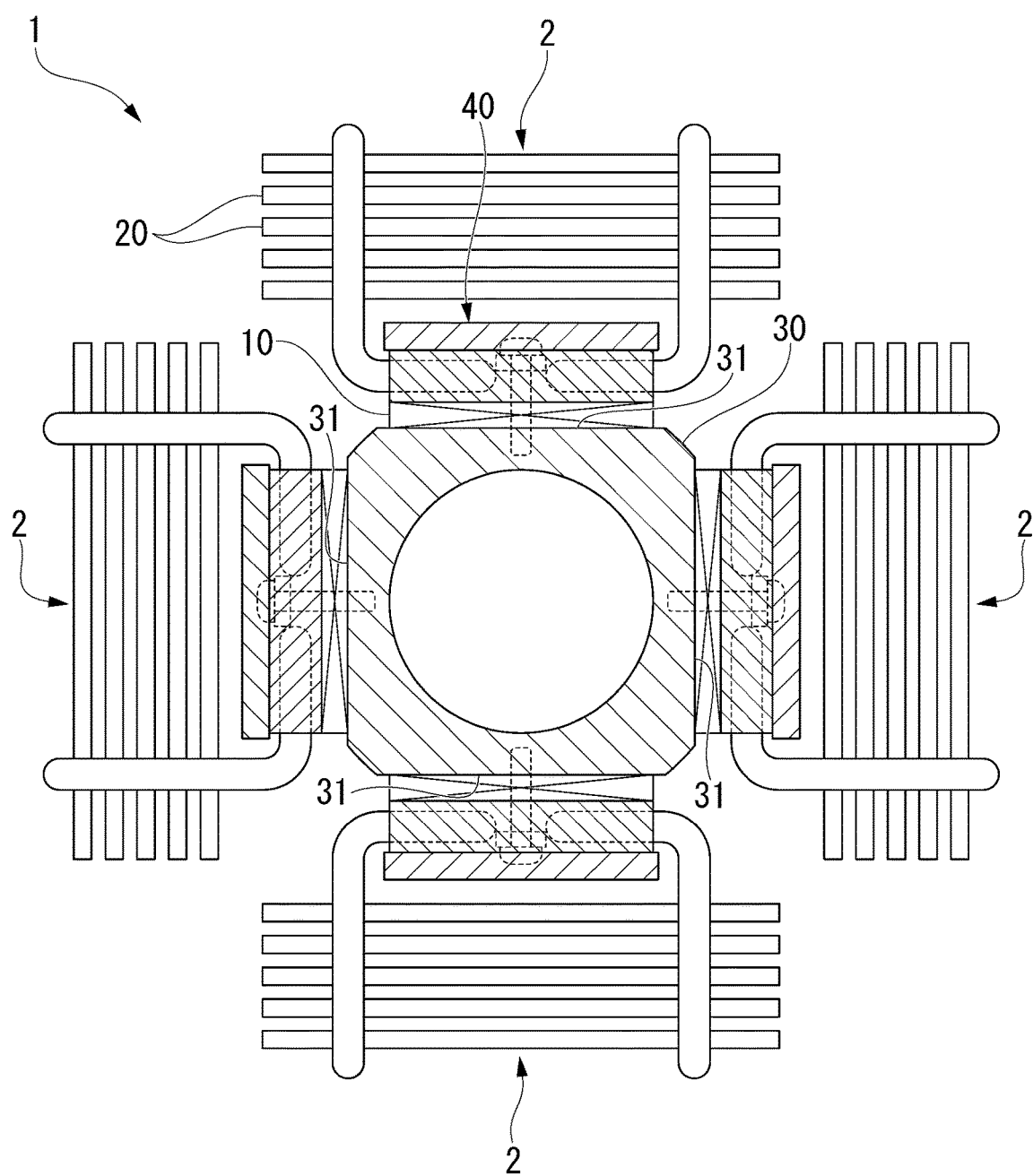
FIG. 9 is a diagram showing a mounting state of pipes of a power generation unit of a temperature difference power generation apparatus according to an application example of an embodiment.

In the form shown in FIG. 9, a plurality of (four in the example of FIG. 9) power generation units 2 each including the thermoelectric conversion element 10, the radiation fins 20 and the pressing mechanism 40 are provided in the circumferential direction of the pipe 30 having a gap therebetween. According to this configuration, it is possible to generate high-voltage power in a small space because the power generation units 2 can be densely installed without lengthening the pipe 30. In this case, a plurality of plane parts 31 may be formed in the pipe 30 to correspond to the plurality of power generation units 2.

Although a hot spring is exemplified as a high-temperature fluid in the aforementioned embodiments, the present invention can also be applied to high-temperature fluids other than a hot spring.

Although parts of the heat pipes 50 are buried in the pipe 30 or the heat pipes 50 are arranged to penetrate the pipe 30 in the above-described forms shown in FIGS. 4 to 8, a form in which the heat pipes 50 wind around the outer circumferential surface 30b of the pipe 30 in a U shape or an Ω shape according to brazing may be employed, for example. According to this configuration, it is possible to generate power with high efficiency because the contact area between the heat pipes 50 and the pipe 30 increases even when though-holes are formed in the pipe 30 or the heat pipes 50 are not buried in the pipe 30.

What is claimed is:

1. A temperature difference power generation apparatus comprising a plurality of power generation units, each of the plurality of power generation units comprising:
    a thermoelectric conversion element configured to convert thermal energy into electric energy based on a temperature difference;
    radiation fins which are thermally connected to a low-temperature side of the thermoelectric conversion element and contactable to outside air;
    a pipe which is thermally connected to a high-temperature side of the thermoelectric conversion element and through which a high-temperature fluid at a higher temperature than the outside air is flowable;
    a plurality of first heat pipes configured to thermally connect the radiation fins and the low-temperature side of the thermoelectric conversion element to each other;
    a base plate having a first plane part connected to the low-temperature side of the thermoelectric conversion element; and
    a pressing mechanism comprising a pressing plate configured to press the high-temperature side of the thermoelectric conversion element to the pipe and a screw member configured to be inserted into a through-hole formed in the pressing plate,
    wherein the radiation fins are supported by one end parts of the plurality of first heat pipes,
    wherein the other end parts of the plurality of first heat pipes are thermally connected to the low-temperature side of the thermoelectric conversion element through the base plate,
    wherein the plurality of first heat pipes are installed in the base plate,
    wherein the plurality of first heat pipes extend from side edge faces of both sides of the base plate in a width direction to both sides thereof in the width direction to support the radiation fins,
    wherein the pressing plate is arranged to extend in a longitudinal direction of the pipe between the plurality of first heat pipes and straddle outer sides of the base plate, and the plurality of first heat pipes are installed in the both sides of the base plate in the width direction,
    wherein the plurality of power generation units are provided in a circumferential direction of the pipe with gaps therebetween,
    wherein a second plane part is formed on an outer circumferential surface of the pipe, the second plane part is mirror-finished to correspond to the thermoelectric conversion element, and the high-temperature side of the thermoelectric conversion element is in contact with the second plane part, and
    wherein the screw member is screw-engaged with a screw hole formed in the second plane part of the pipe.

2. The temperature difference power generation apparatus according to claim 1,
    wherein the pressing mechanism comprises an insulator configured to insulate heat transfer from the pipe.

3. The temperature difference power generation apparatus according to claim 1, wherein the high-temperature side of the thermoelectric conversion element and the pipe are thermally connected to each other through a second heat pipe.

4. The temperature difference power generation apparatus according to claim 3, wherein a part of the second heat pipe is buried in the pipe.

5. The temperature difference power generation apparatus according to claim 3, wherein a lining material having corrosion resistance to the high-temperature fluid is provided in the pipe, and a part of the second heat pipe penetrates the pipe and is buried in the lining material.

6. The temperature difference power generation apparatus according to claim 2, wherein
    the insulator is interposed between the pressing plate and the screw member.

7. The temperature difference power generation apparatus according to claim 6, wherein a width of the pressing plate is greater than a width of the thermoelectric conversion element.

8. The temperature difference power generation apparatus according to claim 3, wherein the second heat pipe is configured to support the thermoelectric conversion element to keep a gap between the thermoelectric conversion element and the pipe.

9. The temperature difference power generation apparatus according to claim 3, wherein a part of the second heat pipe penetrates the pipe and is contactable to the high-temperature fluid.

10. The temperature difference power generation apparatus according to claim 3, wherein a part of the second heat pipe penetrates the pipe and is bent inside the pipe.

11. The temperature difference power generation apparatus according to claim 3, wherein a part of the second heat pipe is buried in the pipe in a state in which the part of the second heat pipe is bent.

12. A measurement system comprising:
    the temperature difference power generation apparatus according to claim 1; and
    a field device comprising a measurer configured to measure a measurement value of the high-temperature fluid and a communicator configured to provide a measurement result of the measurer to an outside of the field device,
        wherein the temperature difference power generation apparatus is configured to supply electric power to the field device.

13. The measurement system according to claim 12, wherein
    the pressing mechanism comprises an insulator configured to insulate heat transfer from the pipe.

14. The measurement system according to claim 12, wherein the high-temperature side of the thermoelectric conversion element and the pipe are thermally connected to each other through a second heat pipe.

15. The measurement system according to claim 14, wherein a part of the second heat pipe is buried in the pipe.

16. The measurement system according to claim 14, wherein a lining material having corrosion resistance to the high-temperature fluid is provided in the pipe, and a part of the second heat pipe penetrates the pipe and is buried in the lining material.

17. The temperature difference power generation apparatus according to claim 1,
    wherein the high-temperature side of the thermoelectric conversion element is in contact with the second plane part via a thermal grease.

* * * * *